(12) United States Patent
Su et al.

(10) Patent No.: US 11,106,134 B2
(45) Date of Patent: Aug. 31, 2021

(54) PHOTOSENSITIVE COMPOSITE MATERIAL AND METHOD FOR FORMING COMPOSITE FILM USING THE SAME

(71) Applicant: INDUSTRIAL TECHNOLOGY RESEARCH INSTITUTE, Hsinchu (TW)

(72) Inventors: Yu-Yang Su, New Taipei (TW); Chih-Jen Yang, Taoyuan (TW); Chyi-Ming Leu, Jhudong Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 117 days.

(21) Appl. No.: 16/226,147

(22) Filed: Dec. 19, 2018

(65) Prior Publication Data

US 2019/0204740 A1 Jul. 4, 2019

(30) Foreign Application Priority Data

Dec. 29, 2017 (TW) ................................ 106146492
Oct. 22, 2018 (TW) ................................ 107137184

(51) Int. Cl.
| | |
|---|---|
| *G03F 7/075* | (2006.01) |
| *G03F 7/20* | (2006.01) |
| *G03F 7/028* | (2006.01) |
| *C08L 83/04* | (2006.01) |
| *G03F 7/004* | (2006.01) |
| *C08G 77/08* | (2006.01) |
| *C08K 3/36* | (2006.01) |
| *C08G 77/20* | (2006.01) |
| *C08G 77/46* | (2006.01) |
| *G03F 7/027* | (2006.01) |
| *C08K 7/26* | (2006.01) |

(52) U.S. Cl.
CPC ............ *G03F 7/0757* (2013.01); *C08L 83/04* (2013.01); *G03F 7/0047* (2013.01); *G03F 7/028* (2013.01); *G03F 7/0755* (2013.01); *G03F 7/2002* (2013.01); *C08G 77/08* (2013.01); *C08G 77/20* (2013.01); *C08G 77/46* (2013.01); *C08K 3/36* (2013.01); *C08K 7/26* (2013.01); *C08K 2201/005* (2013.01); *G03F 7/027* (2013.01)

(58) Field of Classification Search
CPC ............................. G03F 7/0757; G03F 7/0758
See application file for complete search history.

(56) References Cited

U.S. PATENT DOCUMENTS

| | | | |
|---|---|---|---|
| 7,705,431 B1 | 4/2010 | Sanganeria et al. | |
| 7,901,783 B2 | 3/2011 | Rose et al. | |
| 8,758,864 B2 | 6/2014 | Park et al. | |
| 8,864,894 B2 * | 10/2014 | Shibayama | ............ C09D 5/006 106/287.11 |
| 8,969,219 B2 * | 3/2015 | Gvishi | .................. G03F 7/0043 438/780 |
| 9,251,778 B2 | 2/2016 | Wang et al. | |
| 9,359,506 B1 | 6/2016 | Su et al. | |
| 9,422,376 B2 | 8/2016 | Kandanarachchi et al. | |
| 9,454,078 B2 | 9/2016 | Onishi et al. | |
| 9,771,494 B2 | 9/2017 | Su et al. | |
| 2003/0185975 A1 | 10/2003 | Wan et al. | |
| 2007/0266896 A1 * | 11/2007 | Suwa | ........................ G02B 1/14 106/287.16 |
| 2013/0130179 A1 * | 5/2013 | Anno | ........................ C08K 5/34 430/286.1 |

FOREIGN PATENT DOCUMENTS

| | | |
|---|---|---|
| CN | 103589120 A | 2/2014 |
| CN | 103834300 A | 6/2014 |
| CN | 102471425 B | 3/2015 |
| CN | 104740887 A | 7/2015 |
| CN | 105324436 A | 2/2016 |
| TW | I480345 B | 4/2015 |

(Continued)

OTHER PUBLICATIONS

Taiwanese Notice of Allowance and Search Report, dated Feb. 15, 2020, for Taiwanese Application No. 107137184.

(Continued)

*Primary Examiner* — John S Chu

(74) *Attorney, Agent, or Firm* — Birch, Stewart, Kolasch & Birch, LLP

(57) ABSTRACT

A photosensitive composite material is provided. The photosensitive composite material includes 0.1-20.5 parts by weight of a nanoporous silica material, 10.9-68.6 parts by weight of a siloxane polymer, and 10.9-89 parts by weight of a photosensitive siloxane composition, including a siloxane polymer having at least one terminal functional group being vinyl group and a siloxane polymer having at least one terminal functional group being thiol group, based on 100 parts by weight of the photosensitive composite material. The siloxane polymer is a homopolymer of a monomer having a structure of Formula (I)

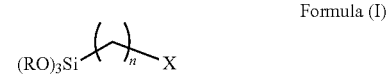

Formula (I)

wherein each of R is independently a linear or branched $C_1$-$C_{10}$ alkyl group, n is a positive integer between 10 and 1000, X includes an alkoxysilyl group, a methacrylate group, an epoxy group, a vinyl group, or an acrylate group.

11 Claims, 1 Drawing Sheet

(56) References Cited

FOREIGN PATENT DOCUMENTS

| TW | I487620 B | 6/2015 |
|----|-----------|---------|
| TW | I494685 B | 8/2015 |
| TW | I523919 B | 3/2016 |
| TW | I558890 B | 11/2016 |

OTHER PUBLICATIONS

Eslava et al., "Zeolite-Inspired Low-k Dielectrics Overcoming Limitations of Zeolite Films," J. Am. Chem. Soc., vol. 130, No. 51, 2008, pp. 17528-17536.

Farrell et al., "Advances in Ultra Low Dielectric Constant Ordered Porous Materials," The Electrochemical Society, 2011, pp. 39-46.

Farrell et al., "Facile and Controlled Synthesis of Ultra-Thin Low Dielectric Constant Meso/Microporous Silica Films," ChemPhysChem, vol. 9, 2008 (published online May 15, 2008), pp. 1524-1527.

Kim et al., "Photo-Curable Siloxane Hybrid Material Fabricated by a thiol-ene Reaction of Sol-Gel Synthesized Oligosiloxanes," Chem. Commun., vol. 47, 2011, pp. 6051-6053.

Lew et al., "Zeolite Thin Films: From Computer Chips to Space Stations," Accounts of Chemical Research, vol. 43, No. 2, Feb. 2010, pp. 210-219.

\* cited by examiner

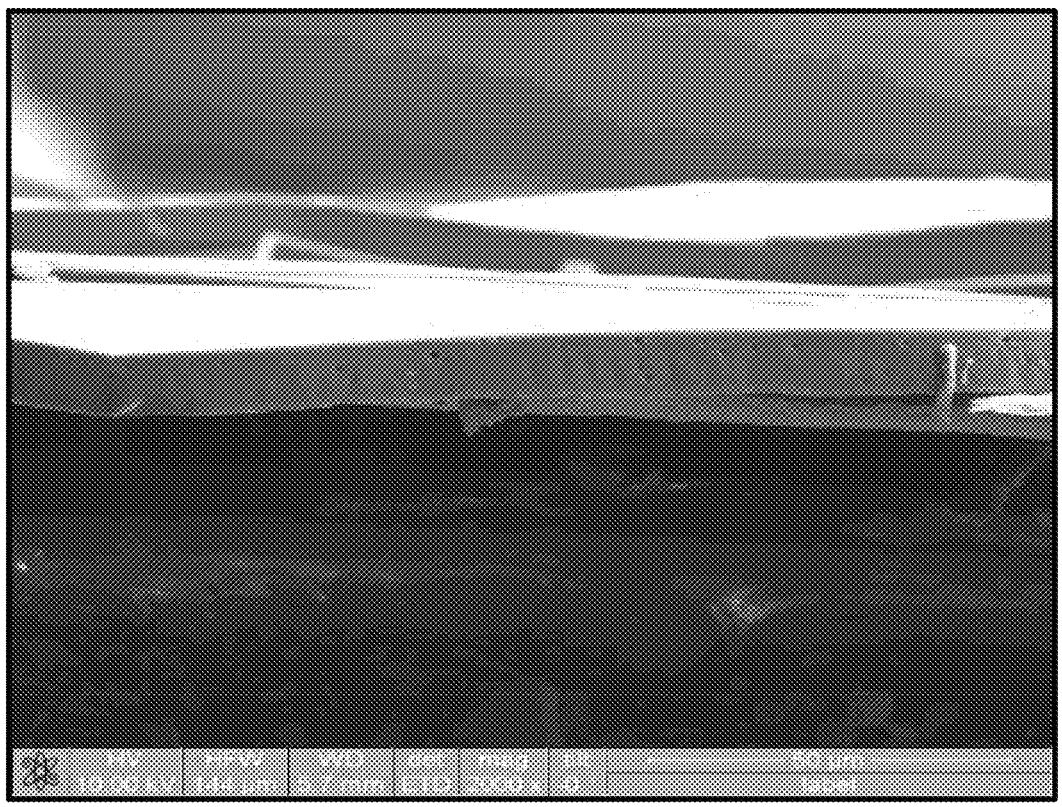

PHOTOSENSITIVE COMPOSITE MATERIAL AND METHOD FOR FORMING COMPOSITE FILM USING THE SAME

CROSS REFERENCE TO RELATED APPLICATIONS

The application is based on, and claims priority from, Taiwan Application Number 106146492, filed on Dec. 29, 2017, the disclosure of which is hereby incorporated by reference herein in its entirety. The application is also based on, and claims priority from, Taiwan Application Serial Number 107137184, filed on Oct. 22, 2018, the disclosure of which is hereby incorporated by reference herein in its entirety.

TECHNICAL FIELD

The disclosure relates to a photosensitive composite material and a method for forming composite film using the same.

BACKGROUND

The miniaturization and thinning of electronic products are the trend of the times. As the technologies in the field of information and communications have been developed rapidly in recent years, electronic products such as smartphones, tablets, or other information and communication devices need to meet the requirements for high-frequency, high-speed, and high-density information processing. Also, the substrate materials of printed circuit boards for transmitting high-frequency signals need to have low dielectric constant, low expansion coefficient, heat resistance, or other characteristics.

While mounting various electronic components (such as transistors, diodes, resistors, capacitors, etc.) within the confined space of a small electronic product, the circuit boards need fine, high-density wirings. However, the high-density wirings will have some negative effects on the electronic products such as signal delay, signal transmission loss, and so on. Therefore, it is an important issue in research and development to develop materials with low dielectric constant, low dissipation factor, good heat resistance, and high glass transition temperature.

In response to the coating requirements for continuous production and environmental issues, it is of an urgent priority to develop a composite material composition that can be coated, and can be formed into a film at a low temperature, and has low-dielectric properties.

SUMMARY

An embodiment of the disclosure provides a photosensitive composite material, including 0.1-20.5 parts by weight of a nanoporous silica material, wherein the surface of the nanoporous silica material and surface of the nanopores thereof have a hydrophobic group; 10.9-68.6 parts by weight of a siloxane polymer, which is a homopolymer of a monomer having a structure of Formula (I)

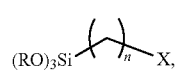

Formula (I)

wherein each of R is independently a linear or branched $C_1$-$C_{10}$ alkyl group, n is a positive integer between 10 and 1000, X includes an alkoxysilyl group, a methacrylate group, an epoxy group, a vinyl group, or an acrylate group; and 10.9-89 parts by weight of a photosensitive siloxane composition, including a siloxane polymer having at least one terminal functional group being vinyl group (—CH═CH$_2$) and a siloxane polymer having at least one terminal functional group being thiol group (—SH); based on 100 parts by weight of the photosensitive composite material.

Another embodiment of the disclosure provides a method for forming a composite film, including mixing the aforementioned photosensitive composite material; forming a film; and curing the film.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein:

FIG. 1 shows a scanning electronic microscope (SEM) photograph of a film formed by the photosensitive composite material of an embodiment of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting.

As used herein, the singular forms "a", "an" and "the" are intended to include the plural forms as well, unless the context clearly indicates otherwise. It will be further understood that the terms "comprises" and/or "comprising,"—when used in this specification, specify the presence of stated features, steps, operations, elements, and/or components, but do not preclude the presence or addition of one or more other features, steps, operations, elements, components, and/or groups thereof.

Embodiments of the present disclosure provide a photosensitive composite material with photosensitivity, which is beneficial to the patterning process. Also, the film formed by the photosensitive composite material provided by the present disclosure has low-dielectric properties.

An embodiment of the present disclosure provides a photosensitive composite material, including 0.1-20.5 parts by weight of a nanoporous silica material, 10.9-68.6 parts by weight of a siloxane polymer, and 10.9-89 parts by weight of a photosensitive siloxane composition, based on 100 parts by weight of the photosensitive composite material.

In some embodiments, the amount of nanoporous silica material in the photosensitive composite material may be 0.1-20.5 parts by weight such as 0.2, 0.5, 1.0, 5, or 10 parts by weights, based on the total weight of the photosensitive composite material. In some embodiments, the particle size of the nanoporous silica material may be between 40 nm and 500 nm. For example, 50 nm, 100 nm, 200 nm, 300 nm, or 400 nm. In some embodiments, the pore size of the nanoporous silica material may be between 2 nm and 50 nm. For example, 5 nm, 10 nm, 20 nm, 30 nm, or 40 nm. In some embodiments, the porosity of the nanoporous silica material may be between 30% and 70%. For example, 40%, 50%, or 60%. The dielectric properties of photosensitive composite material can be reduced by the presence of pores in the nanoporous silica material.

It should be noted that, in the embodiments of the present disclosure, the surface of the nanoporous silica material and surface of the nanopores thereof have a hydrophobic group, which is also sometimes referred to "modified nanoporous silica material" in the present specification. In some embodiments, the hydrophobic group may include a linear or branched $C_1$-$C_{10}$ alkyl group, a vinyl group (—CH=CH$_2$), a propenyl group (—CH=CH—CH$_3$), a phenyl group, or an acrylate group. In some embodiments, the hydrophobic group may be, for example, a vinyl group or a phenyl group. Compositions using the "modified nanoporous silica material" are less prone to aggregation and are beneficial to coating.

In some embodiments, the amount of siloxane polymer in the photosensitive composite material may be 10.9-68.6 parts by weight such as 20, 30, 40, or 50 parts by weight, based on the total weight of the photosensitive composite material.

In some embodiments, the siloxane polymer has a structure of Formula (I):

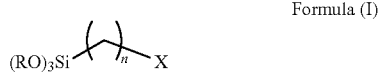

Formula (I)

In Formula (I), each of R is independently a linear or branched $C_1$-$C_{10}$ alkyl group, n is a positive integer between 10 and 1000, X includes an alkoxysilyl group, a methacrylate group, an epoxy group, a vinyl group, or an acrylate group.

In some embodiments, the functional groups of the siloxane polymer and the functional groups on the surface of the modified nanoporous silica material may have the same hydrophobic properties. In this way, the photosensitive composite material is rendered homogeneous.

In some embodiments, the amount of photosensitive siloxane composition in the photosensitive composite material may be 10.9-89 parts by weight such as 20, 30, 40, 50, 60, 70, or 80 parts by weight, based on the total weight of the photosensitive composite material.

In some embodiments, the photosensitive siloxane composition may include a siloxane polymer having at least one terminal functional group being vinyl group (—CH=CH$_2$) and a siloxane polymer having at least one terminal functional group being thiol group (—SH). It should be noted that the molecular weight of the siloxane polymer is not particularly limited. As long as the terminal functional group of the siloxane polymer is the aforementioned vinyl group or thiol group, the siloxane polymer is suitable for the embodiments of the present disclosure.

In some embodiments, the weight ratio of the siloxane polymer having at least one terminal functional group being vinyl group and the siloxane polymer having at least one terminal functional group being thiol group may be, for example, 1:4-4:1. In one embodiment, the weight ratio of the siloxane polymer having at least one terminal functional group being vinyl group and the siloxane polymer having at least one terminal functional group being thiol group is 1:2-2:1 or 1:1.

By controlling the ratio and amount of the aforementioned siloxane polymer having a terminal functional group being vinyl group and the siloxane polymer having a terminal functional group being thiol group, a bond may be formed between them in the subsequent curing step.

However, the photosensitive siloxane composition of the present disclosure is not limited to include the aforementioned siloxane polymer having a terminal functional group being vinyl group and the siloxane polymer having a terminal functional group being thiol group. In some embodiments, the photosensitive siloxane composition may further include other siloxane polymers having one or more functional groups selected from a group consisting of an alkyl group, a phenyl group, a hydrocarbon group, an alkoxysilyl group, a methacrylate group, an epoxy group, a vinyl group, a thiol group, an acrylate group, and combinations thereof.

In some embodiments, the photosensitive siloxane composition may further include an initiator, a catalyst, a surfactant, or a combination thereof. The initiator can be used to absorb ultraviolet light sources and promote a polymerization reaction of the siloxane polymer in the photosensitive siloxane composition for curing. In some embodiments, the initiator may be, for example, a photoinitiator. The photoinitiator may be, for example, acetophenone, phenyl ketone, biimidazole, or a combination thereof. In one embodiment, the photoinitiator may be 2,2-dimethoxy-2-phenylacetophenone. In some embodiments, the catalyst may be, for example, a cationic catalyst, an anionic catalyst, an acid, a base, and so on. In some embodiments, the surfactant may be, for example, polyoxyethylene-8-octyl phenyl ether (Triton-X-100), cetyltrimethylammonium bromide (CTAB), or other suitable surfactants.

An embodiment of the present disclosure provides a method for forming a composite film, including mixing the aforementioned photosensitive composite material; forming a film; and curing the film. In some embodiments, the photosensitive composite material may be coated on substrates such as a polyethylene film, a polyethylene terephthalate film, a glass, etc., and then cured by an ultraviolet light irradiation to form a film. In some embodiments, the coating method for the photosensitive composite material may include, for example, spray coating, roll coating, dip coating, bar coating, spin coating, knife coating, brush coating, or a combination thereof. In some embodiments, before the ultraviolet light irradiation, a drying process may be performed at 100-200° C. for 5-20 minutes. In one embodiment, the temperature of the drying process may be 110-150° C., and the time of the drying process may be 10-15 minutes. After drying, the ultraviolet light irradiation may be performed for 5-60 seconds for curing. The portions which are not irradiated by the ultraviolet light are cleaned and removed by solvents such as acetone. In one embodiment, the exposure time of the ultraviolet light irradiation is 7-20 seconds. In this step, the film having low dielectric and patternable characteristics provided by the present disclosure is accomplished.

Compared to the inorganic insulating materials in the past, which cannot be formed into a film continuously or whose film thickness cannot exceed 1 µm, the film provided by the present disclosure can be formed into a film at a low temperature and the thickness thereof may be greater than 1 µm, for example, may be between 1 µm and 90 µm. Therefore, the film provided by the present disclosure has a wider scope of possible technical applications. In some embodiments, the thickness of the film provided by the present disclosure may be adjusted according to practical needs. For example, the thickness may be between 12 µm and 85 µm. In one embodiment, the dielectric constant of the film is less than 3.258. In another embodiment, the dielectric constant of the film is less than 3.

By adequately adjusting the various components in the photosensitive composite material, the photosensitive composite material provided by the embodiments of the present disclosure may be formed into a film at a low temperature, for example, lower than 200° C., through a simple coating process. Thus, the problem of high film-forming temperature of organic polymer materials and the problem that inorganic insulating materials cannot be formed into a film continuously in the past were solved. Also, the resulting film may have a thickness of greater than 1 μm, rendering a wider scope of possible technical applications. In addition, since the photosensitive composite material includes siloxane polymers, wherein the siloxane polymer having a terminal functional group being vinyl group forms a bond with the siloxane polymer having a terminal functional group being thiol group after the ultraviolet light irradiation, making the photosensitive composite material have photosensitivity and patternable characteristics. Therefore, the films formed by the aforementioned photosensitive composite material not only meet the requirements for low-dielectric properties under high-frequency conditions but also have patternable characteristics.

The Examples and Comparative Examples are described below to illustrate the photosensitive composite material and the film formed therefrom provided by the present disclosure and the properties thereof.

[Preparation Example 1] Preparation of Nanoporous Silica Material A

1. Preparation of Unmodified Nanoporous Silica Particles A1

8.2 g of cetyltrimethylammonium bromide (CTAB) was added to a 2 L PP straight-type bottle, then 1.08 g of NaOH and 1939.14 g of water were added to dissolve CTAB in the NaOH-containing water. Next, 37.48 mL of tetraethoxysilane (TEOS) was added and stirred for 2 hours. Then, the resulting product was washed with deionized water/acetone several times. Solvent extraction method was used to remove cetyltrimethylammonium bromide (CTAB). Then, the preparation of the nanoporous silica particles A1 was accomplished.

The average particle size of the resulting nanoporous silica particles A1 was about 50-60 nm. The pore size of the resulting nanoporous silica particles A1 was about 2.2 nm. The porosity of the resulting nanoporous silica particles A1 was about 58%.

2. Preparation of Nanoporous Silica Particles A2 Having Vinyl Groups (—CH=CH$_2$) on the Surface 2 g of nanoporous silica particles A1 were added to a solution including 100 g of vinyltriethoxysilane (VTES) and tolunen (the volume ratio of VTES and tolunen was 1:5). After reacting at 110° C. for 2-4 hours, the mixture was filtered and washed with ethanol/water. After drying, hydrophobic nanoporous silica particles A2 having vinyl groups were obtained.

The average particle size of the resulting nanoporous silica particles A2 was about 50-65 nm. The pore size of the resulting nanoporous silica particles A2 was about 2.2 nm. The porosity of the resulting nanoporous silica particles A2 was about 53%.

3. Preparation of Nanoporous Silica Particles A3 Having Phenyl Groups on the Surface 2 g of nanoporous silica particles A1 were added to a solution including 100 g of phenyltrimethoxysiloxane and tolunen (the volume ratio of phenyltrimethoxysiloxane and tolunen was 1:3). After reacting at 110° C. for 2-4 hours, the mixture was filtered and washed with ethanol/water. After drying, hydrophobic nanoporous silica particles A3 having vinyl groups were obtained.

The average particle size of the resulting nanoporous silica particles A3 was about 45-73 nm. The pore size of the resulting nanoporous silica particles A3 was about 2 nm. The porosity of the resulting nanoporous silica particles A3 was about 48%.

4. Preparation of Nanoporous Silica Particles A4 Having Methyl Groups (—CH$_3$) on the Surface 2 g of nanoporous silica particles A1 were added to a solution including 100 g of hexamethyldisilazane (HMDS) and tolunen (the volume ratio of HMDS and tolunen was 1:2). After reacting at 110° C. for 2-4 hours, the mixture was filtered and washed with ethanol/water. After drying, hydrophobic nanoporous silica particles A4 having vinyl groups were obtained.

The average particle size of the resulting nanoporous silica particles A4 was about 50-70 nm. The pore size of the resulting nanoporous silica particles A4 was about 2.1 nm. The porosity of the resulting nanoporous silica particles A4 was about 52%.

[Preparation Example 2] Preparation of Siloxane Polymer B

Firstly, 255.3 g of ethanol was added to a round-bottom flask. Next, 400 g of 3-glycidoxypropyl trimethoxysilane was added to the round-bottom flask. The mixture was evenly stirred, and then 99.9 g of water and 20 mL of hydrochloric acid (0.01 M) were sequentially added. After stirring at room temperature (about 25° C.) for 3 hours, excess solvent was removed by using a reduced pressure distillation (24 mm-Hg). Then, the preparation of siloxane polymer B was accomplished. After drying, the product was weighted. The solid content of the product was between 55% and 79%. The storability was maintained.

[Preparation Example 3] Preparation of Photosensitive Siloxane Composition C

1. Preparation of Siloxane Polymer C1 Having Vinyl Groups (—CH=CH$_2$) at Terminal 109.2 g of vinyltriethoxysilane (VTES) and 0.181 g of Ba(OH)$_2$.8H$_2$O were added to a round-bottom flask and mixed, stirred at 100° C. in nitrogen gas. Then, the mixture was slowly added to 62.056 g of diphenylsilanediol (DPSD) in batches. After 5 hours of reaction, the mixture was filter by a 5 μm filter and stored. Then, the siloxane polymer having vinyl groups at terminal was obtained.

2. Preparation of Siloxane Polymer C2 Having Thiol Groups (—SH) at Terminal 117.9 g of 3-mercaptopropyltrimethoxysilane (3-MPS) and 0.2046 g of Ba(OH)$_2$.8H$_2$O were added to a round-bottom flask and mixed, stirred at 100° C. in nitrogen gas.

Then, the mixture was slowly added to 70.168 g of diphenylsilanediol (DPSD) in batches. The reaction was kept up for 5 hours. The mixture was filter by a 5 µm filter and stored. Then, the siloxane polymer having thiol groups at terminal was obtained.

3. Preparation of Photosensitive Siloxane Composition C3

The siloxane polymer C1 having vinyl groups at terminal obtained at step 1, the siloxane polymer C2 having thiol groups at terminal obtained at step 2, 2,2-dimethoxy-2-phenylacetophenone used as photoinitiator, and PGME used as solvent were mixed at room temperature (about 25° C.) and fully stirred. Then, the preparation of the photosensitive siloxane composition C3 was accomplished. In particular, the weight ratio between the siloxane polymer C1 having vinyl groups at terminal, the siloxane polymer C2 having thiol groups at terminal, the photoinitiator, and the solvent were 1:1:0.02:2.

4. Preparation of Photosensitive Siloxane Composition C4

The siloxane polymer C1 having vinyl groups at terminal obtained at step 1, the siloxane polymer C2 having thiol groups at terminal obtained at step 2, 2,2-dimethoxy-2-phenylacetophenone used as photoinitiator, and PGME used as solvent were mixed at room temperature (about 25° C.) and fully stirred. Then, the preparation of the photosensitive siloxane composition C4 was accomplished. In particular, the weight ratio between the siloxane polymer C1 having vinyl groups at terminal, the siloxane polymer C2 having thiol groups at terminal, the photoinitiator, and the solvent were 0.5:1:0.02:2.

[Examples 1-8] [Comparative Examples 1-4]

Preparation of Photosensitive Composite Material

According to the type and weight ratio of the components shown in Table 1, the aforementioned nanoporous silica material A obtained in Preparation Example 1, the siloxane polymer B obtained in Preparation Example 2, and the photosensitive siloxane composition C obtained in Preparation Example 3 were mixed and fully stirred at room temperature (about 25° C.). Then, the preparations of various photosensitive composite materials were accomplished.

Preparation of the Film

The photosensitive composite materials obtained in Examples 1-8 and Comparative Examples 1-4 were coated on a glass by using a knife coater. Next, a drying process was performed at 150° C. for 15 minutes. After drying, the ultraviolet light irradiation was performed for curing. The portions which were not irradiated by the ultraviolet light were cleaned and removed by acetone. In this step, the film was formed. The thickness of the films formed in various Examples and Comparative Examples are shown in Table 1.

Evaluation of Uniformity of the Film

During the preparation of photosensitive composite materials, particles were aggregated and settled within a short period of time (24 hours) in Comparative Examples 3-4 after mixing and fully stirring. As a result, the photosensitive composite material cannot form a uniform coating. No obvious particle aggregation or settlement was observed in Examples 1-8 even after being stored for a long time (7 days), and a uniform coating can be formed. Therefore, according to the comparison of Comparative Examples 3-4 and Examples 1-8, it can be realized that the addition of the siloxane polymer B can improve the dispersity of nanoporous silica particles in the photosensitive composite material, making it easier for the photosensitive composite material to be formed into a film.

FIG. 1 shows a cross-sectional view of scanning electronic microscope (SEM) of a film formed by the photosensitive composite material of Example 1. As shown in FIG. 1, a uniform coating can be formed by using the photosensitive composite material of Example 1, and the thickness thereof is about 10.5 µm.

Evaluation of Dielectric Properties of the Film

The films formed by the aforementioned Examples 1-8 and Comparative Examples 1-4 were used as samples to evaluate their dielectric properties. The dielectric constant of each film was measured with an interface film tester. The obtained values are shown in Table 1. As can be realized from Table 1, Examples 1-8 have lower dielectric constants than Comparative Examples 1-4.

Evaluation of UV Irradiation Curing Time Required for Curing the Film

Since the component ratios of various embodiments are different, the required curing time is also different. The UV irradiation curing time required for various embodiments is shown in Table 1. Generally speaking, a shorter UV irradiation curing time indicates better photosensitivity. Although the UV irradiation curing time required for the films formed by Comparative Examples 1, 3, and 4 was shorter, the dielectric constants thereof were too high.

The photosensitive composite material provided by the embodiments of the present disclosure has the advantage of being able to be formed into a film at a low temperature (150° C.) through a simple coating process. Also, the film formed by such a photosensitive composite material has a uniform thickness and the thickness is greater than 1 µm (for example, the average thickness is between 12 µm and 84 µm), and thus it has a wider scope of possible technical applications. In addition, the film provided by the embodiments of the present disclosure simultaneously has low dielectric constant (the dielectric constant is less than 3) and patternable characteristics under high-frequency conditions (10 GHz), and thus it is suitable for use as a dielectric material for the redistribution layer (RDL) in packaging technology.

It will be apparent to those skilled in the art that various modifications and variations can be made to the disclosed embodiments. It is intended that the specification and examples be considered as exemplary only, with the true scope of the disclosure being indicated by the following claims and their equivalents.

TABLE 1

| | photosensitive composite material | | | | | | | |
|---|---|---|---|---|---|---|---|---|
| | nanoporous silica material A | | | photosensitive siloxane composition C | | film | | |
| | type | parts by weight | siloxane polymer B (parts by weight) | type | parts by weight | average thickness (μm) | dielectric constant (Dk) (10 GHz) | UV irradiation curing time (sec) |
| Example 1 | A3 | 0.71 | 44.59 | C3 (C1:C2:photoinitiator = 1:1:0.02) | 54.7 | 84 | 2.451 | 20 |
| Example 2 | A3 | 0.52 | 21.26 | C3 (C1:C2:photoinitiator = 1:1:0.02) | 78.22 | 45 | 2.613 | 10 |
| Example 3 | A3 | 0.26 | 44.05 | C3 (C1:C2:photoinitiator = 1:1:0.02) | 55.69 | 65 | 2.932 | 15 |
| Example 4 | A4 | 0.25 | 30.1 | C3 (C1:C2:photoinitiator = 1:1:0.02) | 69.65 | 12 | 2.566 | 7 |
| Example 5 | A2 | 0.3 | 59 | C3 (C1:C2:photoinitiator = 1:1:0.02) | 40.7 | 18 | 2.703 | 7 |
| Example 6 | A2 | 3 | 47 | C4 (C1:C2:photoinitiator = 0.5:1:0.02) | 50 | 41 | 2.206 | 14 |
| Example 7 | A2 | 11 | 52.5 | C4 (C1:C2:photoinitiator = 0.5:1:0.02) | 36.5 | 20 | 2.151 | 20 |
| Example 8 | A2 | 20.5 | 60.5 | C4 (C1:C2:photoinitiator = 0.5:1:0.02) | 19 | 32 | 2.052 | 60 |
| Comparative Example 1 | N/A | 0 | 0 | C3 (C1:C2:photoinitiator = 1:1:0.02) | 100 | 10 (nonuniform) | 4.010 | 7 |
| Comparative Example 2 | A1 | 0.8 | 99.2 | — | | 78 | 3.570 | 150° C./30 min drying |
| Comparative Example 3 | A1 | 0.8 | 0 | C3 (C1:C2:photoinitiator = 1:1:0.02) | 99.2 | 50 (nonuniform) | 3.30 | 15 |
| Comparative Example 4 | A2 | 3.59 | 0 | C3 (C1:C2:photoinitiator = 1:1:0.02) | 96.41 | 49 (nonuniform) | 3.258 | 10 |

[Note]
parts by weight: parts by weight of solid content components
A1: unmodified nanoporous silica particles
A2: A1 with vinyl groups (—CH=CH$_2$) on the surface
A3: A1 with phenyl groups on the surface
A4: A1 with methyl groups (—CH$_3$) on the surface
C1: siloxane polymer having a terminal group of vinyl groups (—CH=CH$_2$)
C2: siloxane polymer having a terminal group of thiol groups (—SH)
C3: photosensitive siloxane composition
C4: photosensitive siloxane composition
photoinitiator: 2,2-dimethoxy-2-phenylacetophenone

What is claimed is:

1. A photosensitive composite material, comprising 0.1-20.5 parts by weight of a nanoporous silica material, wherein the surface of the nanoporous silica material and surface of the nanopores thereof have a hydrophobic group;

10.9-68.6 parts by weight of a siloxane polymer, which is a homopolymer of a monomer having a structure of Formula (I)

Formula (I), wherein each of R is independently a linear or branched $C_1$-$C_{10}$ alkyl group, n is a positive integer between 10 and 1000, X comprises an alkoxysilyl group, a methacrylate group, an epoxy group, a vinyl group, or an acrylate group;

10.9-89 parts by weight of a photosensitive siloxane composition, comprising a siloxane polymer having at least one terminal functional group being vinyl group (—CH=CH$_2$) and a siloxane polymer having at least one terminal functional group being thiol group (—SH); and an initiator, a catalyst, a surfactant, or a combination thereof, based on 100 parts by weight of the photosensitive composite material.

2. The photosensitive composite material as claimed in claim 1, wherein the particle size of the nanoporous silica material is between 40 nm and 500 nm.

3. The photosensitive composite material as claimed in claim 1, wherein the pore size of the nanoporous silica material is between 2 nm and 50 nm.

4. The photosensitive composite material as claimed in claim 1, wherein the porosity of the nanoporous silica material is between 30% and 70%.

5. The photosensitive composite material as claimed in claim 1, wherein the hydrophobic group comprises a linear or branched $C_1$-$C_{10}$ alkyl group, a vinyl group, a propenyl group, a phenyl group, or an acrylate group.

6. The photosensitive composite material as claimed in claim 1, wherein the weight ratio of the siloxane polymer having at least one terminal functional group being vinyl group and the siloxane polymer having at least one terminal functional group being thiol group is 1:4-4:1.

7. The photosensitive composite material as claimed in claim 1, wherein the photosensitive siloxane composition further comprises other siloxane polymers having one or more functional groups selected from a group consisting of an alkyl group, a phenyl group, a hydrocarbon group, a alkoxysilyl group, a methacrylate group, an epoxy group, a vinyl group, a thiol group, an acrylate group, and combinations thereof.

8. A method for forming a composite film, comprising:
mixing the photosensitive composite material as claimed in claim 1;
forming a film; and
curing the film.

9. The method for forming a composite film as claimed in claim 8, wherein the average thickness of the film is between 1 μm and 90 μm.

10. The method for forming a composite film as claimed in claim 8, wherein the siloxane polymer having a terminal functional group being vinyl group in the photosensitive siloxane composition forms a bond with the siloxane polymer having a terminal functional group being thiol group after the photosensitive composite material is cured.

11. The method for forming a composite film as claimed in claim 8, wherein the curing is performed by applying an ultraviolet light irradiation.

* * * * *